United States Patent [19]

Kamezaki et al.

[11] Patent Number: 5,196,384

[45] Date of Patent: Mar. 23, 1993

[54] METHOD FOR PREPARING GREEN SHEETS

[75] Inventors: Hiroshi Kamezaki; Masato Wakamura; Kishio Yokouchi; Yoshihiko Imanaka; Nobuo Kamehara, all of Kawasaki, Japan

[73] Assignee: Fujitsu Limited, Kawasaki, Japan

[21] Appl. No.: 761,006

[22] Filed: Sep. 17, 1991

[30] Foreign Application Priority Data

Sep. 17, 1990 [JP] Japan .................. 2-246502

[51] Int. Cl.⁵ .................................. C03C 14/00
[52] U.S. Cl. .................................. 501/32; 501/80; 501/65; 501/77
[58] Field of Search .............. 501/32, 80, 65, 66, 501/77; 502/10

[56] References Cited

U.S. PATENT DOCUMENTS

| | | | |
|---|---|---|---|
| 3,061,495 | 10/1962 | Alford | 501/80 X |
| 4,219,791 | 8/1980 | Moore et al. | 501/94 X |
| 4,767,726 | 8/1988 | Marshall | 501/32 X |
| 4,821,142 | 4/1989 | Ushifusa et al. | 361/395 |
| 4,867,935 | 9/1989 | Morrison, Jr. | 264/61 |
| 4,939,021 | 7/1990 | Aoki et al. | 501/5 X |
| 5,069,702 | 12/1991 | Block et al. | 501/39 X |

FOREIGN PATENT DOCUMENTS 0234896  9/1987  European Pat. Off. .

OTHER PUBLICATIONS

Chemical Abstracts, vol. 107, No. 26, Dec. 1987, Columbus, Ohio, US; Abstract No. 241347B, Y. Imanaka et al.: "Crystallization of Low-Temperature-Fired Glass/Ceramic Composite," p. 289; * abstract * & Yogyo Kyokaishi, vol. 95, No. 12, 1987, pp. 1119–1121.

Primary Examiner—Mark L. Bell
Assistant Examiner—Chris Gallo
Attorney, Agent, or Firm—Staas & Halsey

[57] ABSTRACT

Methods for preparing a green sheet and a glass ceramic substrate are herein disclosed.

The object of these methods is to make green sheets and glass ceramic substrates practically acceptable, the green sheets and the glass ceramic substrates having a low dielectric constant and low scattering in properties, and the method comprises the steps of preparing a mixture of hollow silica microspheres, borosilicate glass powder and ceramic powder as a principal ingredient, adding a plasticizer, a binder and a solvent to the mixture, kneading the mixture and forming it into a green sheet, wherein the shell-thickness of the hollow silica microspheres is controlled so that the specific gravity of the hollow silica microspheres is approximately equal to that of the solvent and wherein an inorganic substance containing aluminum as a constituent element such as alumina, mullite or aluminum nitride is used as the ceramic powder for forming the green sheet; or the method further comprises the step of calcining the resulting green sheet.

8 Claims, 4 Drawing Sheets

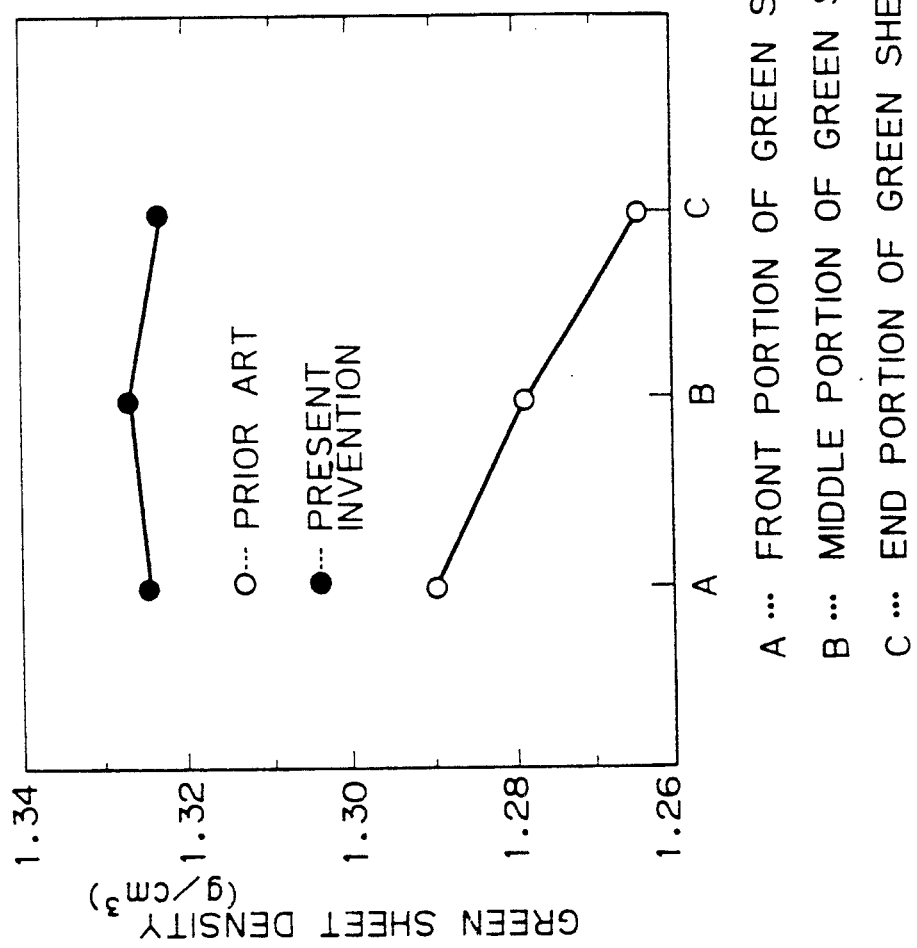

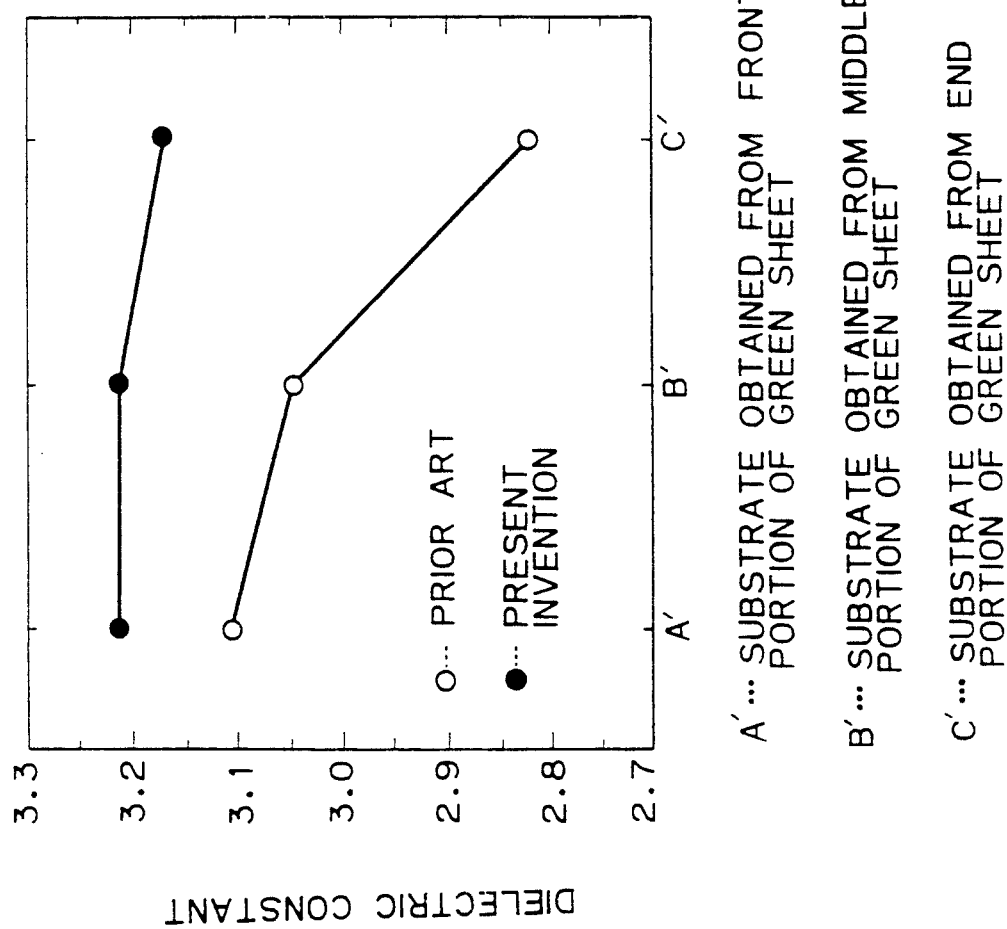

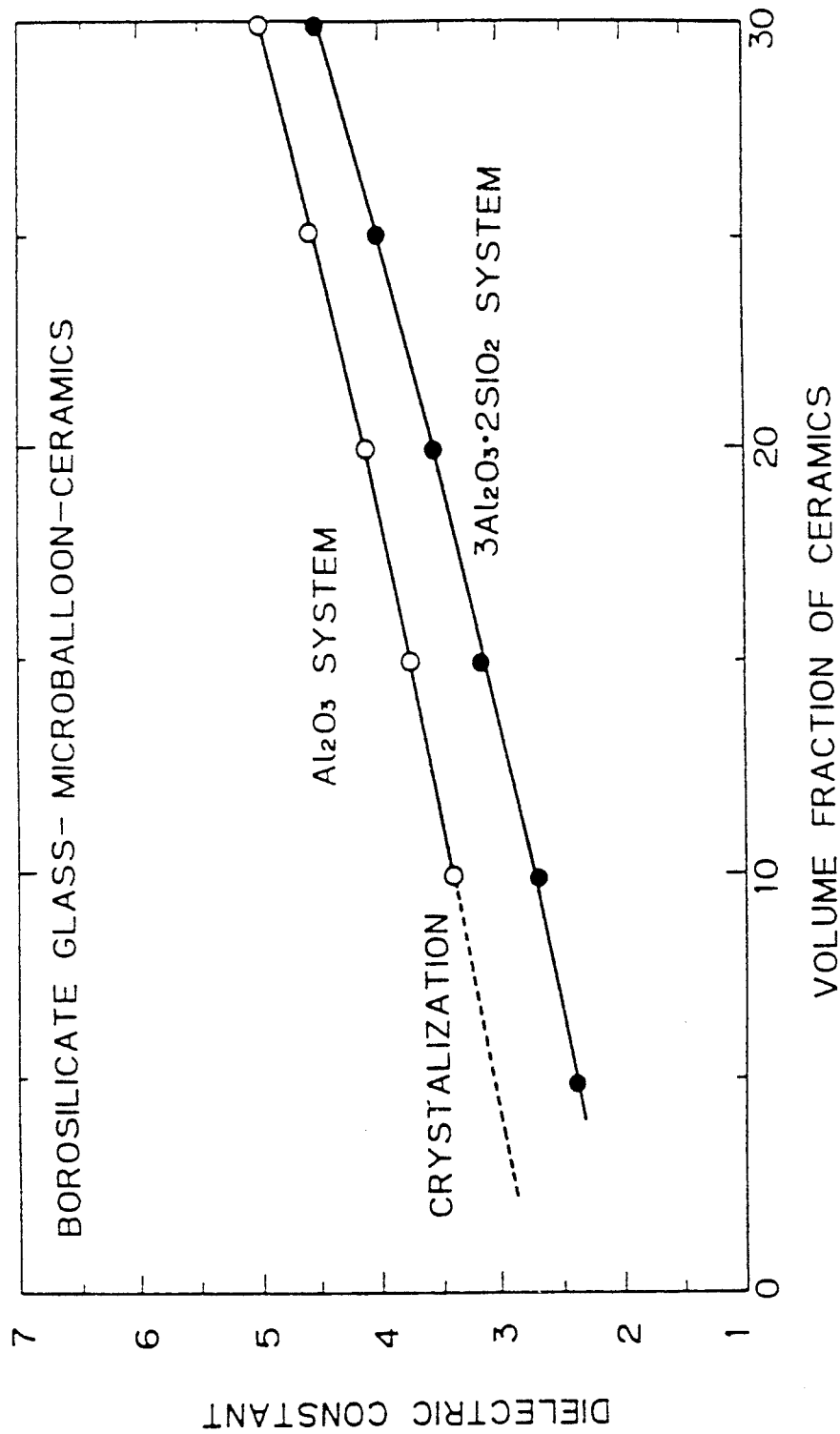

METHOD FOR PREPARING GREEN SHEETS

BACKGROUND OF THE INVENTION

1. Field of the Invention

The present invention relates to a method for preparing a green sheet and a method for preparing, from the green sheet obtained according to the foregoing method, a glass ceramic substrate which has a low dielectric constant and which only shows a slight scatter (i.e. variation) in properties from substrate to substrate.

2. Description of the Related Art

Frequencies of signals used are becoming increasingly higher for the purpose of more quickly processing large quantity of information and furthermore, optical signal communication has been adopted as a means for transmitting such high frequency information signals.

In this respect, a multilayered circuit board on which an electronic circuit for processing such high speed or high frequency, is to be formed, must fulfill the requirements such that the delay time $\tau$ of an electric signal should be as small as possible and that the cross talk between wirings should be very low. In order to obtain substrates which these requirements, the dielectric constant $\epsilon$ of materials for the substrate must be reduced, as will be seen from the following relation (1):

$$\tau = \epsilon^{\frac{1}{2}}/c \qquad (1)$$

Wherein $\epsilon$ is the dielectric constant of the material or substrate and c represents the velocity of light.

To substantially reduce the transmission loss, conductive lines, to be formed in a pattern on the substrate, must be formed from a metal having low specific resistance.

Incidentally, it is a matter of course that variations in the electric properties, such as dielectric constant and insulation resistance as well as mechanical properties such as surface roughness and the shrinkage factor, should be very low, from substrate to substrate.

The inventors of this invention have already proposed, as a means for solving these problems, that glass ceramics be used as materials for substrates and that electronic circuits should be formed from copper (Cu).

More specifically, the green sheets mainly comprising alumina ($Al_2O_3$; $\epsilon = 10$) should be calcined at a temperature of not less than 1300° C., while the burning temperature for glass ceramic green sheets mainly comprising a mixture of alumina powder and borosilicate glass powder can be reduced down to not more than 1000° C. (see Japanese Unexamined Patent Publication No. 57-995). This permits the formation of a wiring pattern with Cu (having a melting point of 1084° C.).

However, the dielectric constant of such a glass ceramic substrate ranges from 4 to 6 and correspondingly, the reduction of the delay time of signals is not yet sufficient.

Under such circumstances, the inventors of this invention have also proposed the use of hollow silica microspheres to reduce the dielectric constant of substrates (Japanese Patent Application No. 2-252500).

In other words, among the inorganic dielectrics, silica ($SiO_2$) has the lowest dielectric constant $\epsilon$ of the order of 3.8. Further, silica powder can be made hollow to thus form a composite dielectric with air. As a result, the dielectric constant can further be reduced as seen from the following relation (2):

$$\epsilon_0 = (\epsilon_1 \cdot \epsilon_2)/(\epsilon_1 v_2 + \epsilon_2 v_1) \qquad (2)$$

Wherein $\epsilon_0$ is the dielectric constant of the composite dielectric; $v_1$ is the ratio of the volume occupied by the dielectric having a dielectric constant of $\epsilon_1$ to the whole volume of the composite dielectric; and $v_2$ is the ratio of the volume occupied by the dielectric (air) having a dielectric constant of $\epsilon_2$ to the whole volume of the composite dielectric.

The hollow silica microspheres can be prepared by making use of the phenomenon that in the heat-decomposition of organic silicon-containing compounds such as methoxy silicate [$Si(OCH_3)_4$] or ethoxy silicate [$Si(OC_2H_5)_4$], the constituent thereof is separated and forms bubbles. Among the hollow silica microspheres thus prepared, those having a particle size of not less than 100 $\mu$m have presently been used as fillers for concrete or additives for light weight molded bodies of resins.

The inventors have also proposed a glass ceramic substrate whose dielectric constant is reduced by the use of hollow silica microspheres having a particle size of not more than 20 $\mu$m and preferably 1–10 $\mu$m in place of a ceramic which constitutes a glass ceramic substrate (Japanese Unexamined Patent Publication No. 59-111345).

However, in practical applications of such a substrate, the following problems arise:

It was found that when a green sheet was formed in the conventional manner, calcined to give a substrate and the dielectric constant thereof was determined, the dielectric constant varied from substrate to substrate although green sheets prepared from the same slurry were used. Moreover, it was also found that when the green sheets were prepared by the doctor blade method, the dielectric constant of the substrate obtained from the front portion of the slurry was greater than that of the substrate obtained from the middle and end portions of the slurry (see, FIG. 1, FIG. 3 and FIG. 4).

Furthermore, it was likewise found that the green sheet caused crystallization during the burning process, the surface of the resulting substrate was extremely uneven, the thermal expansion coefficient thereof was abnormally increased and thus the resulting substrate was unfavorable for fitting it with an Si semiconductor chip.

Moreover, the inventors have also proposed, as a means for forming a glass ceramic substrate having a low dielectric constant, a method for preparing a glass ceramic substrate which comprises the steps of providing hollow silica microspheres, forming a green sheet from a mixed powder mainly comprising the hollow silica microspheres and borosilicate glass powder and then calcining the green sheet (Japanese Patent Application No. 2-252500).

However, this method suffers from a variety of problems which remains to be solved. For instance, the dielectric constant of the substrates thus prepared greatly varies from substrate to substrate (see FIG. 4) and the silica causes crystallization during the burning process of a green sheet containing the same.

In the preparation of multilayered ceramic substrates, a sheet called "green sheet" comprising a ceramic and a resin is first prepared. However, the hollow silica microspheres, added to a solvent used for the preparation, float on the surface of the resulting slurry (FIG. 1) and finally causes separation, because the specific gravity thereof is smaller than that of the solvent and this correspondingly leads to the formation of non-uniform green sheets (FIG. 3). Moreover, the preparation of a multi-layered substrate by the green sheet method suffers from another problem in that a part of the hollow silica microspheres are destroyed because of the pressure of a press applied during lamination. Further, when hollow silica microspheres are incorporated into a resin for the purpose of reducing the weight or dielectric constant thereof, they preferentially distribute in the upper portion of the resin matrix before the solidification thereof because of the difference in the specific gravity between the hollow silica microspheres and the resin and hence it is likewise difficult to uniformly distribute the hollow silica microspheres in this case. For this reason, the shrinkage factor of the portion rich in the hollow silica microspheres after heating is high, while that of the portion deficient in the hollow silica microspheres is low. This becomes a cause of deformation, warps or peeling in case of films, upon heating.

BRIEF SUMMARY OF THE INVENTION

Accordingly, an object of the present invention is generally to solve the foregoing problems and more particularly to provide a method for preparing a uniform green sheet as well as a uniform ceramic substrate having a low dielectric constant.

The foregoing object of the present invention can be achieved the method for preparing a green sheet in accordance with the invention which comprises the steps of preparing a mixture of hollow silica microspheres, borosilicate glass powder and ceramic powder as a principal ingredient, adding a plasticizer, a binder and a solvent to the mixture, kneading the mixture and forming it into green sheet, wherein the thickness of the shell of each of the hollow silica microspheres is controlled so that he specific gravity of the hollow silica microspheres is approximately equal to that of the solvent. According to another aspect of the present invention, there is provided a method for preparing a ceramic substrate having a low dielectric constant which comprises the step of burning the green sheet prepared according to the foregoing method.

BRIEF DESCRIPTION OF THE DRAWINGS

The object as well as advantages of the present invention will become clear from the following description of preferred embodiments of the present invention with reference to the accompanying drawings, in which:

FIG. 3 is a graph showing the relationship between the green sheet density and the portion of the green sheet;

FIG. 4 is a graph showing the relationship between the dielectric constant and the substrate obtained; and FIG. 5 is a graph showing the relationship between the dielectric constant and the volume fraction of ceramics.

DETAILED DESCRIPTION OF THE PREFERRED EMBODIMENTS

Figure 1:
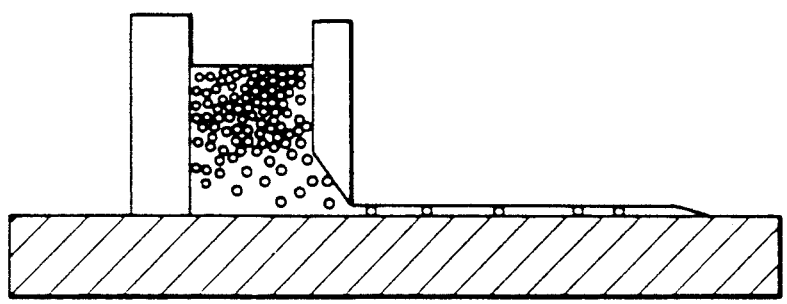
FIG. 1 is a schematic view showing the method of forming a green sheet by a prior art method.

As has already been discussed above, the dielectric constant of the glass ceramic substrate prepared by the method previously proposed by the inventions varies from substrate to substrate (See Prior Art data of FIG. 4) (FIG. 4). The inventors have found out, as a result of intensive studies, that this is attributable to the low specific gravity of the hollow silica microspheres and the separation thereof during the formation of a green sheet (FIG. 1, FIG. 3).

More specifically, the specific gravity of silica is 2.2, while the apparent specific gravity of the hollow silica microspheres is very low, on the order of 0.3 to 0.4. For this reason, the hollow silica microspheres undergo separation within the slurry during the formation of a green sheet (FIG. 1) and accordingly the resulting substrates do not have a uniform composition (FIG. 3, FIG. 4).

Figure 2:
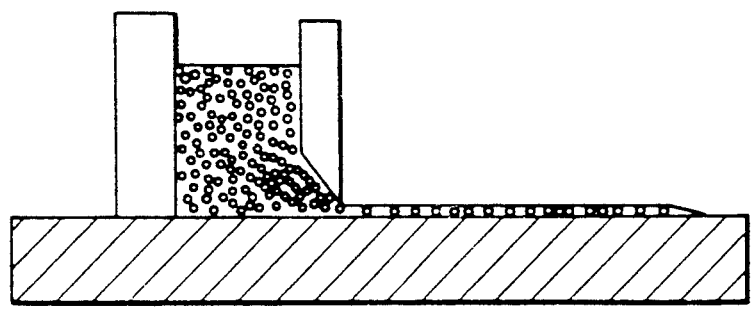
FIG. 2 schematic view showing the method of forming a green sheet by the present method.

Under such circumstances, the inventors have conducted various studies and thus have found out that if the shell-thickness of the hollow silica microspheres is controlled so that the specific gravity of the microspheres is approximately equal to that of a solvent used for preparing a slurry, they can be uniformly mixed with other ingredients and thus can provide a slurry free of the separation problem (FIG. 2).

Methods for controlling the shell-thickness of the hollow silica microspheres can roughly be classified into two groups.

The first method comprises dispersing hollow silica microspheres in a solvent similar to that used for preparing a slurry and thereby to perform selection in advance.

The second method comprises coating the surface of hollow silica microspheres with a glassy substance.

When the control of the shell-thickness of hollow silica microspheres is practiced according to the first method of the invention, the hollow silica microspheres are added to an organic solvent and stirred to form a dispersion therein. The solvent used in this process can be properly selected from the group consisting of acetone (specific gravity ($\rho$)=0.792), methyl ethyl ketone ($\rho$=0.806), ethanol ($\rho$=0.789), methanol ($\rho$=0.791), trichloroethylene ($\rho$=1.459) and mixture thereof such as acetone/methyl ethyl ketone mixed solvent ($\rho$=0.80). After allowing the dispersion to stand for 5 minutes, those floating on the liquid surface and those deposited at the bottom are removed and those suspended in the solvent are recovered followed by drying same for practical use.

In the present invention, the second method comprises coating hollow silica microspheres with an inorganic substance to increase the specific gravity of the hollow silica microspheres thereby to prevent the separation of the hollow silica microspheres from a solvent or a resin prior to solidification. The surface of the hollow silica microspheres can be coated with an inorganic substance such as a glass or ceramic by the sol-gel method. For instance, if hollow silica microspheres having a diameter of 10 $\mu$m and a shell-thickness of 0.5 $\mu$m are coated with a layer of an inorganic substance having a thickness of 1 $\mu$m, the specific gravity of the microspheres theoretically increases from 0.53 (for the microspheres free of coating) to 1.17. If the microspheres are coated with silica, an alkoxide of silicon such as ethyl silicate [$Si(C_2H_5O)_4$] is used as a starting material. Moreover, if the hollow silica microspheres are coated with a variety of multicomponent glasses, alkoxides of elements which constitute the glasses are mixed together to form a sol. If they are coated with alumina, aluminum isopropoxide: Al [$OCH(CH_3)_2$]$_3$ is used as a starting material.

It has been well-known that, in the preparation of a conventional ceramic substrate mainly comprising borosilicate glass powder and ceramic powder (i.e., a ceramic substrate free of hollow silica microspheres), the borosilicate glass powder causes phase transition to cristobalite from silica component of the borosilicate glass by crystallization and hence crystallization upon heating and as a result, the thermal expansion coefficient thereof rapidly increases from its original value ranging from 4 to $5.5 \times 10^{-7}/°C$. to about $1 \times 10^{-5}/°C$. A conventional measure for preventing the crystallization is to add a ceramic containing aluminum and in general alumina has been used as such a ceramic component.

In other words, in the conventional method for preparing a glass ceramic substrate, the simultaneous use of alumina powder and borosilicate glass serves to reduce the burning temperature of the resulting substrate and to prevent the crystallization of the glass.

In the present invention, alumina ($Al_2O_3$) is used as a crystallization-inhibiting agent. In addition, mullite ($3Al_2O_3 \cdot 2SiO_2$) powder or aluminum nitride (AlN) powder or spinel ($MgO \cdot Al_2O_3$) powder can likewise be suitably used.

In the method of preparing a ceramic substrate in accordance with the invetion, the greensheet prepared by the method of explained above was cut into 90 mm squares. Then many 75 $\mu$m via-holes were bored by a punching machine. A conductor paste of copper was printed thereon to form a circuit pattern by a screen printing method. Thirty greensheets thus obtained were laminated at 130° C. at a pressure of 30 MPa to obtain a laminated body. A sintering process was carried out in two steps. First the laminated body was fired in an electric furnace at a temperature of 800° C. for 4 hours in an atmosphere of wet nitrogen gas to burn out the organic binder, and then, fired at a temperature ranging from about 900° C. to about 1000° C., but preferably at 1000° C. for 2 hours in a dry nitrogen gas atmosphere. Thus, a ceramic multilayered circuit substrate was prepared.

The present invention will hereinafter be explained in more detail with reference to the following Examples, but the present invention is by no means limited to these specific Examples.

EXAMPLE 1

Elimination of the Scatter in Dielectric Constant

Conventional hollow silica microspheres have a particle size ranging from 3 to 20 $\mu$m, a shell-thickness of about 0.5 $\mu$m and an apparent specific gravity of 0.316. In this Example, hollow silica microspheres were added to a 1:3 acetone/methyl ethyl ketone mixed solvent ($\rho=0.80$) and then stirred. After allowing the dispersion to stand for 5 minutes, those floating on the liquid surface and deposited at the bottom are removed to recover only those suspended in the solvent followed by drying. Thus, hollow silica microspheres having a specific gravity of 0.80 were obtained.

Using the hollow silica microspheres thus obtained, green sheets and substrates were prepared in the following manner.

The hollow silica microspheres (98 g), borosilicate glass (230 g), alumina powder (130 g), poly(methyl methacrylate) (50 g) as a binder, dibutyl phthalate (30 g) as a plasticizer, methyl ethyl ketone (290 g) as a solvent component and acetone (55 g) as a solvent component were introduced into a pot free of milling balls and kneaded over 18 hours to give a uniform slurry.

After degassing the slurry, it was formed into a green sheet having a thickness of 300 $\mu$m according to the doctor blade method.

Sheet-like pieces having a size of 9×9 cm were stamped out from the resulting green sheet, 8 pieces were put in layers and calcined at 950° C. for 5 hours in the air.

The dielectric constants $\rho$ of the layered substrates obtained from the forefront portion and end portion of a conventional green sheet as well as those of the present invention were determined at 1 MHz.

As a result, the dielectric constants $\rho$'s were 3.1 for the conventional substrate obtained from the forefront portion and; 2.8 for the conventional substrate obtained from the end portion, while both the front and end portions of the substrate prepared by the method of the present invention had an $\rho$ of 3.2. This clearly indicates that any variations in the dielectric constant was not observed.

Crystallization within the substrate was not observed.

EXAMPLE 2

Mullite Was Used as a Crystallization-inhibiting Agent

Glass ceramic multilayered substrates were prepared in the same manner as Example 1 except that a slurry was prepared from 119 g of the same hollow silica microspheres as those used in Example 1, 215 g of borosilicate glass powder, 25 g of mullite powder and the same binder, plasticizer and solvents as those used in Example 1. The dielectric constant $\rho$ at 1 MHz of the resulting glass ceramic multilayered substrate was determined and was found to be 2.4. Moreover, crystallization was not observed in the substrate.

EXAMPLE 3

AlN Was Used as a Crystallization-inhibiting Agent

The same procedures as used in Example 2 were repeated except that 35 g of AlN powder was substituted for 25 g of mullite powder to give a glass ceramic substrate. The dielectric constant $\epsilon$ at 1 MHz of the resulting layered substrate was determined and was found to be 2.7. Moreover, crystallization was not observed in the substrate.

EXAMPLE 4

Coating Method

To coat the surface of hollow silica microspheres with a silica film according to the sol-gel method, 50 g of hollow silica microspheres having an average particle size of 10 $\mu$m were added to a solution prepared from 100 g of $Si(C_2H_5O)_4$, 140 g of $C_2H_5OH$, 150 g of $H_2O$ and 2.0 g of HCl. The silicon alkoxide solution was stirred to activate hydrolysis of the solution to some extent. At the time when the gelation of the solution was initiated, the solution, including the hollow silica microspheres, was dried by spray-drying. The resulting powder was heated to 700° C. in the air in an electric furnace so that the coating film underwent a dehydration-condensation reaction to thus give a compact silica film. In this respect, the higher the viscosity of the solution, the greater the thickness of the coating film. The coating can also be carried out by simply drying the microspheres while they are still immersed in the solution without using the spray-drying method, but in this case, it is liable to cause coagulation of the hollow silica microspheres and, therefore, it is difficult to uniformly disperse them to obtain a desired slurry.

Although the average specific gravity of the hollow silica microspheres prior to the coating was 0.65, which was lower than that of the organic solvent, the resulting hollow silica microspheres covered with silica coating had an average specific gravity of 1.08 and most of the hollow silica microspheres did not float on the liquid surface. The shell-thickness of the coated hollow silica microspheres was greater than that of the uncoated microspheres and hence the strength of the former was enhanced. For this reason, the breakage of the hollow silica microspheres was readily prevented in the preparation of a hollow silica microsphere-containing a ceramic multilayered substrate according to the green sheet method.

Using the hollow silica microspheres thus obtained, green sheets and substrates were prepared from the following components:

| glass ceramic component | |
| --- | --- |
| hollow silica microspheres | 20 wt % |
| borosilicate glass powder | 40 wt % |
| alumina powder | 40 wt % |
| Total | 100 wt % |
| organic component (wt %) to the total glass ceramic component | |
| polyvinyl butylal (binder) | 10 wt % |
| dibutyl phthalate (plasticizer) | 5 wt % |
| methyl ethyl ketone (solvent) | 70 wt % |
| acetone (solvent) | 15 wt % |
| Total | 100 wt % |

The components were introduced into a pot free of milling balls and kneaded over 18 hours to give a uniform slurry.

After degassing the slurry, it was formed into a green sheet having a thickness of 300 μm according to the doctor blade method.

Sheet-like pieces having a size of 9×9 cm were stamped out from the resulting green sheet, 8 pieces were put in layers and calcined at 950° C. for 5 hours in the air.

The dielectric constants ε of the layered substrates obtained from the front portion and the end portion of a conventional green sheet as well as those of the present invention were determined at 1 MHz.

The dielectric constant ε of the ceramic multilayered substrate thus prepared was determined. As a result, it was found to be about 3.2 over the entire surface of the substrate and scattering (i.e. variation) in ε was not observed (FIG. 4 (●—●)). On the other hand, there was observed scattering in the dielectric constant of the substrates prepared according to the conventional method, i.e., the dielectric constant ε was 3.1 for the front portion of a green sheet and 2.8 for the end portion thereof (FIG. 4 (o—o)).

EXAMPLE 5

Coating Method

The same procedures used in Example 4 were repeated except that a solution for coating hollow silica microspheres was prepared by additionally adding 8 g of $B(OCH_3)_3$ to the solution used in Example 4 and that 50 g of hollow silica microspheres having a diameter of 10 μm were added to the resulting alkoxide solution to form a gel-like film on the surface of the hollow silica microspheres. The coated hollow silica microspheres were heated to 500° C. in the air in an electric furnace so that the gel-like alkoxide underwent a dehydration-condensation reaction to thus convert the gel into a glass film. In this respect, the heating temperature used was lower than that used in Example 4. This is because the softening point of the glass is lowered by the addition of boron alkoxide and thus the mixed alkoxide can be converted into a glass at a lower temperature.

As has been explained above, in the present invention, the shell-thickness of hollow silica microspheres is properly controlled so that the specific gravity thereof is approximately equal to that of a solvent used for preparing a slurry. Thus, the separation of hollow silica microspheres from the solvent due to the low specific gravity thereof, which is observed during the preparation of a green sheet, can effectively be prevented by the use of such specific gravity-controlled hollow silica microspheres. This, in turn, leads to the reduction of the scattering (i.e., variation) in the dielectric constant of the resulting green sheet or ceramic substrate and hence makes it possible to prepare green sheets and glass ceramic substrates having a low dielectric constant. Furthermore, the crystallization of silica possibly caused during the burning process of a green sheet can likewise effectively be prevented by the use of a crystallization-inhibiting agent and thus glass ceramic substrates free of such crystallization can be prepared.

Moreover, if coated hollow silica microspheres obtained through the coating method are used in the preparation of ceramic multilayered substrates, it would be possible to prevent the breakage of the hollow silica microspheres observed during lamination and pressing thereof.

FIG. 5 shows the relationship between the dielectric constant and the volume fraction of ceramics in the substrate composed of borosilicate glass-microfalloon-ceramics system.

In the $Al_2O_3$ system, the volume fraction of $Al_2O_3$ should be more than about 10 to prevent the crystallization. In the $3Al_2O_3 \cdot 2SiO_2$ system, the volume fraction of $3Al_2O_3 \cdot 2SiO_2$ should be more than about 5 to prevent the crystallization.

FIG. 5 show the fact that the dielectric constant of the $3Al_2O_3 \cdot 2SiO_2$ system is lower than that of the $Al_2O_3$ system.

We claim:

1. A method for preparing a green sheet comprising the steps of:
   preparing a mixture of hollow silica microspheres, borosilicate glass powder and ceramic powder as a principle ingredient;
   adding a plasticizer, a binder and a solvent to the mixture;
   kneading the mixture and forming it into a green sheet; and
   for the step of preparing the mixture, providing hollow silica microspheres having the same specific gravity as that of the solvent, said specific gravity being in the range of from about 0.78 g/cm$^3$ to about 1.50 g/cm$^3$.

2. The method of claim 1, wherein the step of providing the hollow silica microspheres of said same specific gravity as that of the solvent comprises:
   forming a dispersion of hollow silica microspheres in a volume of the solvent; and
   selectively recovering the hollow silica microspheres which are suspended in the solvent by removing the hollow silica microspheres which are floating on the liquid surface of the volume of the solvent and those which are deposited at the bottom of the volume of the solvent, the hollow silica microspheres, of the dispersion thereof, which remain suspended in the solvent thereby having said same specific gravity as that of the solvent.

3. The method of claim 1, wherein the step of providing the hollow silica microspheres of said same specific gravity as that of the solvent comprises:

mixing tetraethoxy silane, water, ethanol and hydrochloric acid to form a solution thereof;

selecting hollow silica microspheres having an average particle diameter of about 10 μm and an average specific gravity of about 0.5 g/cm$^3$ and immersing the selected hollow silica microspheres in the solution;

stirring the solution to activate an hydrolysis;

drying the thus stirred and activated solution by a spray-dry method; and heating the hollow silica microspheres thereby to form coated microspheres having an average specific gravity of about 1.08 g/cm$^3$.

4. The method of claim 1, wherein the step of providing the hollow silica microspheres of said same specific gravity as that of the solvent comprises:

mixing tetraethoxy silane, trimethoxy boron, water, ethanol and hydrochloric acid to provide a solution thereof;

selecting hollow silica microspheres having an average particle diameter of about 10 μm and an average specific gravity of about 0.5 g/cm$^3$ and immersing the hollow silica microspheres in the solution;

stirring the solution to activate an hydrolysis;

drying the thus stirred and activated solution by a spray-dry method; and heating the resultant microspheres to form coated microspheres having and average specific gravity of about 1.08 g/cm$^3$.

5. The method of claim 1 wherein the ceramic powder comprises aluminum as a constituent element.

6. The method of claim 1 wherein the ceramic powder is selected from the group consisting of alumina, mullite and aluminum nitride powder.

7. A method for producing a ceramic substrate having a improved value of dielectric constant, comprising the steps of:

preparing a mixture of hollow silica microspheres, borosilicate glass powder and ceramic powder as a principal ingredient, adding a plasticizer, a binder and a solvent to the mixture, kneading the mixture and forming it into a green sheet, and for the step of preparing the mixture, providing hollow silica microspheres having the same specific gravity as that of the solvent, said specific gravity being in the range of from about 0.78 g/cm$^3$ to about 1.50 g/cm$^3$; and calcining the green sheet thereby to produce the ceramic substrate.

8. The method of claim 7 wherein the calcining step is performed by firing the green sheet at a temperature in the range from about 950° C. to about 1050° C.

* * * * *

UNITED STATES PATENT AND TRADEMARK OFFICE
CERTIFICATE OF CORRECTION

PATENT NO. : 5,196,384
DATED : March 23, 1993
INVENTOR(S) : Hiroshi KAMEZAKI et al.

It is certified that error appears in the above-indentified patent and that said Letters Patent is hereby corrected as shown below:

Col. 1, line 14, after "processing" insert --a--;
line 20, after "frequency," insert --information signals--.

Col. 2, lines 56-57, after "problems" insert --,--.

Col. 3, line 5, change "are" to --is--;
line 28, after "achieved" insert --by--;
line 34, after "into" insert --a--;
line 36, change "he" to --the--;
line 68, delete "(FIG.4)".

Col. 4, line 42, after "removed" insert --,--;
line 43, after "recovered" insert --,--;
line 44, after "for" insert --subsequent,--;
line 50, after "surface" insert --of each--.

Col. 5, line 35, after "then," insert --was--;
line 55, after "removed" insert --, thereby--.

Col. 6, line 8, change "$\rho$" to --$\epsilon$--;
line 12, change "$\rho$" to --$\epsilon$--;
line 17, change "$\rho$" to --$\epsilon$--;
line 18, change "variations" to --variation--;
line 31, change "$\rho$" to --$\epsilon$--.

UNITED STATES PATENT AND TRADEMARK OFFICE
CERTIFICATE OF CORRECTION

PATENT NO. : 5,196,384

DATED : March 23, 1993

INVENTOR(S) : Hiroshi KAMEZAKI et al.

It is certified that error appears in the above-indentified patent and that said Letters Patent is hereby corrected as shown below:

Col. 7, line 53, after "scattering" insert --(i.e., variation)--.

Col. 10, line 7, change "and" to --an--.

Signed and Sealed this

Fifth Day of July, 1994

*Attest:*

BRUCE LEHMAN

*Attesting Officer*          *Commissioner of Patents and Trademarks*